United States Patent [19]

Nomura

[11] Patent Number: 5,321,249
[45] Date of Patent: Jun. 14, 1994

[54] SOLID-STATE IMAGING DEVICE AND METHOD OF MANUFACTURING THE SAME

[75] Inventor: Toru Nomura, Takatsuki, Japan

[73] Assignee: Matsushita Electric Industrial Co., Ltd., Osaka, Japan

[21] Appl. No.: 891,827

[22] Filed: Jun. 1, 1992

[30] Foreign Application Priority Data

Oct. 31, 1991 [JP] Japan .................. 3-285912

[51] Int. Cl.$^5$ .......................... H01L 27/14
[52] U.S. Cl. .................. 250/208.1; 257/294
[58] Field of Search ............. 250/208.1, 216; 257/290, 291, 294; 430/7, 24, 339

[56] References Cited

U.S. PATENT DOCUMENTS

| | | | |
|---|---|---|---|
| 4,416,961 | 11/1983 | Drexhage | 430/7 |
| 4,920,075 | 4/1990 | Morita | 437/228 |
| 5,124,543 | 6/1992 | Kawashima | 250/208.1 |
| 5,172,206 | 12/1992 | Iizuka | 257/294 |

*Primary Examiner*—David C. Nelms
*Assistant Examiner*—Stephone B. Allen
*Attorney, Agent, or Firm*—Ratner & Prestia

[57] ABSTRACT

A solid-state imaging device includes a color filter on a substrate formed from a colored transparent material having a pigment with specified spectral transmissivity characteristics. The color filter possesses a plurality of spectral transmissivity characteristics in one layer. The distance from the color filter to the light sensing parts of the substrate is relatively uniform for all of the filter regions. This reduces flicker and other image characteristics defects. Since the device is not a laminate structure, cracks in the color filter due to thermal impact are reduced, and reliability is enhanced.

4 Claims, 8 Drawing Sheets

SOLID-STATE IMAGING DEVICE AND METHOD OF MANUFACTURING THE SAME

BACKGROUND OF THE INVENTION

1. Field of the Invention

The present invention relates to a solid-state imaging device furnished with a single-layer color filter having a microlens, and a method of manufacturing the same.

2. Prior Art

As a method of fabricating a color solid-state imaging device, recently, the method of forming a color filter directly on a substrate on which the solid-state imaging device is in the mainstream. In a smaller solid-state imaging device, a microlens is formed on a color filter, and the incident light is focused on the light sensing part through the microlens so as to enhance the light sensing sensitivity.

A conventional solid-state imaging device and its manufacturing method are described herein while referring to the drawings. FIG. 17 is a partial cross section showing the constitution of a conventional solid-state imaging device. FIGS. 18 to 31 are partial cross sections showing the method of manufacturing a conventional solid-state imaging device shown in FIG. 17 in the sequence of processes.

First in FIG. 17, the constitution of a conventional solid-state imaging device is explained.

Plural (e.g. four in FIG. 17) transparent resin layers 2 are formed in order to planarize the surface asperities of a solid-state imaging device substrate 1. Above a light sensing part 3, a first color filter layer 4, a second color filter layer 5 and a third color filter layer 6 are formed. Further, a microlens 7 is formed above each light sensing part 3. In other words, the transparent resin layers 2 are formed between the light sensing part 3 and the first color filter layer 4, the second color filter layer 5, the third color filter layer 6 and the microlens 7 respectively so as to prevent mixture of colors and to planarize the first color filter layer 4, second color filter layer 5 and third color filter layer 6. In this constitution, the solid-state imaging device having a color filter is realized.

Its operation is as follows.

The light entering the microlens 7 in the uppermost layer is focused, and is separated into lights having spectral transmissivity characteristics individually by the first color filter layer 4, second color filter layer 5 and third color filter layer 6. The separated lights enter the light sensing part 3 beneath each color filter layer. The lights entering the light sensing part 3 are converted into electric signals, and therefore the solid-state imaging device functions to present color pictorial images.

In FIGS. 18 to 31, a manufacturing method of a conventional solid-state imaging device is described.

FIG. 18 shows the state of planarizing the surface by forming the transparent resin layer 2 on the solid-state imaging device substrate 1.

FIG. 19 shows the state of forming a dye base material layer 8 using a dye base material adding a photosensitizer containing chromium (VI) to gelatin, casein or the like. In succession, FIG. 20 shows the state of forming a patterned dye base layer 9. As shown in FIG. 19, the patterned dye base layer 9 is formed by exposing dye base material layer 8 using a mask and then developing and rinsing the dye base material layer 8. FIG. 21 shows the state of forming the first color filter layer 4 by dyeing the patterned dye base layer 9 by using a first dye solution.

FIG. 22 shows the state of forming the transparent resin layer 2 on the first color filter layer 4 for the purpose of planarizing the surface asperities of the first color filter layer 4 and preventing the mixture of colors in the subsequent dye process. FIG. 23 shows the state of forming the dye base material layer 8 similarly as in FIG. 19. FIG. 24 shows the state of forming the patterned dye base layer 9. The patterned dye base layer 9 is also formed by an exposure process using a mask and then developing and rinsing the dye base material layer 8 shown in FIG. 23. FIG. 25 shows the state of forming the second color filter layer 5 by dyeing the patterned dye base layer 9 by using a second dye solution.

FIG. 26 shows the state of forming the transparent resin layer 2 on the second color filter layer 5 for the purpose of planarizing the surface asperities of the second color filter layer 5 and preventing the mixture of colors in the subsequent dye process. FIG. 27 shows the state of forming the dye base material layer 8 similarly as in FIG. 23. FIG. 28 shows the state of forming the patterned dye base layer 9. The patterned dye base layer 9 is formed by an exposure process using a mask and then developing and rinsing the dye base material layer 8 shown in FIG. 27. FIG. 29 shows the state of forming the third color filter layer 6 by dyeing the patterned dye base layer 9 by using a third dye solution.

FIG. 30 shows the state of forming the transparent resin layer 2 on the third color filter layer 6 for the purpose of planarizing the surface asperities of the third color filter layer 6.

FIG. 31 finally shows the state of forming the microlens 7 by patterning the photosensitive material and treating the material by heating or the like.

The conventional constitution of the solid-state imaging device has a multilayer constitution having plural transparent resin layers 2 formed between adjacent color filter layers 4-6. The conventional solid-state imaging device is accordingly weak to thermal impact from outside, and is limited in reliability. In addition, as the distance between each color filter layer and light sensing part 3 becomes longer, flicker and other defects occur in the image characteristics. Further, since the color filter layers are formed in steps, some of the incident lights run through color filter layers, and unseparated lights enter to cause defects such as white-out and white blemish in the image characteristics. The white-out means that the white point occurs on the color pictorial image. The white-out happens when non separated lights enter the light sensing part 3. Moreover, since the distance from the microlens 7 to the light sensing part 3 is long, the focusing efficiency becomes poor, and the improvement of light sensitivity of the light sensing part 3 is limited.

In the conventional manufacturing method of the solid-state imaging device, the dye base material adding a photosensitizer containing chromium (VI) to gelatin, casein or the like is used, which causes the problem of contamination by chromium. By repeating, still further, the steps of forming and dyeing the dye base layer by using the dye base material to form the first color filter layer 4, second color filter layer 5 and third color filter layer 6, many process steps are desirable to form the solid-state imaging device. Further, although the conventional manufacturing method includes the dyeing process, the conventional method causes the problems of swelling of the color filter layer pattern. As a result, the pattern dimensions are changed before and after dyeing. In the dyeing process, the dyeing occurs while a plurality of significant dyeing conditions are strictly controlled. These dyeing conditions include dye solution temperature, concentration, pH, dyeing time and dyeing fluctuations.

The invention intends to solve the above problems of the prior art. The distance from the color filter layers to the light sensing part is minimized, and the color filter layers are not mutually different in steps. As a result, a solid-state imaging device presenting excellent image characteristics is realized. It is also an object of the invention to present a manufacturing method free from chromium contamination during the dyeing process.

SUMMARY OF THE INVENTION

The invention relates to a solid-state imaging device comprising light sensing parts sequentially formed on a solid-state imaging device substrate, a color filter layer of a single layer possessing partially different spectral transmissivity characteristics, an etching resistant material layer of a flat surface formed on the color filter layer, and a microlens formed on the etching resistant material layer.

The invention also relates to a manufacturing method comprising a step of forming a colored transparent material layer on a solid-state imaging device substrate, a step of forming an etching resistant material layer selectively on the colored transparent material layer, a step of forming a color filter by etching the colored material layer using the etching resistant material layer as a mask, and a step of forming a microlens on the etching resistant material layer.

In the constitution of the solid-state imaging device of the invention, the microlens is disposed above the color filter layer of a single layer, which is formed in the same layer being made of the colored transparent material. Accordingly, the distance from the color filter layer to the light sensing part is not long, and the distance from the color filter layer to the light sensing part is constant, and therefore flicker and other image characteristic deteriorations are eliminated. Moreover, since the light focused by the microlens enters efficiently into the light sensing part, the light sensitivity of the light sensing part is enhanced. Unlike the prior art, there is no transparent material layer between color filters, and the color filter layers are not piled up. Therefore white-out, white blemish or similar image characteristic defects due to passing of the incident light through the color filters may be avoided. Furthermore, because of the single layer structure, cracks due to external thermal impact or similar occurrences are eliminated, and a solid-state imaging device of enhanced reliability is realized.

In the manufacturing method of a solid-state imaging device of the invention, the step of forming the color filter layer using a colored transparent material layer different in the spectral transmissivity characteristic is repeated. Therefore, without the dyeing step, the color filter layer having plural spectral transmissivity characteristics is composed of a single layer. In addition, the material for forming the color filter layer does not contain harmful substances such as chromium (VI), and the problem of contamination is hence eliminated.

DETAILED DESCRIPTION OF THE INVENTION

Figure 1:
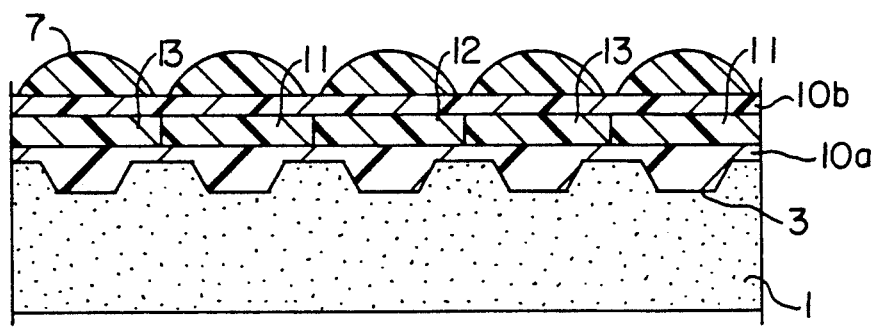
FIG. 1 is a partial cross section showing the constitution of a solid-state imaging device in a first embodiment of the invention.

Referring now to the drawings, several exemplary embodiments of the invention are described in detail below.

FIG. 1 is a partial cross section showing the constitution of a solid-state imaging device according to a first embodiment of the invention. FIGS. 2 to 16 are partial cross sections showing the manufacturing method of a solid-state imaging device in a second embodiment of the invention in a sequence of processes.

FIG. 1, the constitution of the solid-state imaging device of the first embodiment of the invention is explained below.

To planarize the surface asperities of the solid-state imaging device substrate 1, a first etching resistant material layer 10a is formed on the light sensing part 3. On the first etching resistant material layer 10a of a desired light sensing part 3, a first color filter layer 11, a second color filter layer 12 and a third color filter layer 13 are formed respectively in a same layer, being composed of a colored transparent material mainly made of an acrylic material. On the first color filter layer 11, second color filter layer 12 and third color filter layer 13, a second etching resistant material layer 10b is formed for the purpose of planarizing the surface and adjusting the focal length. A microlens 7 is formed thereon. The sectional shad of the microlens 7 is formed in a radius of curvature suited to the focal length up to the light sensing part 3 in a semicircular shape. In other words, each microlens 7 has substantially hemispheric shape. In such a structure, the solid-state imaging device having a color filter is realized.

In this constitution, since the first color filter layer 11, second color-filter layer 12 and third color filter layer 13 are formed in a same layer, the distance between the light sensing part 3 and each color filter layer is uniform and not long. As a result, flicker and other image defects are eliminated. In addition, by the function of microlens 7 and an appropriate focal length, the incident light is focused efficiently on the light sensing part 3, and the light sensitivity of the light sensing part 3 is high, and the solid-state imaging device of excellent image characteristics is realized. Besides, the overall thickness of the color filter is not great, and the constitution is not of multiple layers as in the prior art, and cracks and other breakages due to external thermal impact are extremely reduced. Since the colored transparent material for forming the color filter is mainly made of an acrylic material, and a color filter layer which is excellent in hardening properties is realized, a solid-state imaging device with a high reliability is realized.

Incidentally, when the first color filter layer 11 is composed of a colored transparent material layer having a spectral transmissivity characteristic of red, the second color filter layer 12 of green, and the third color filter 13 of blue, a solid-state imaging device having R, G, B color filters is obtained. Instead of red, green and blue, a colored transparent material having spectral transmission characteristics of complementary colors of magenta, yellow and cyan may be also used.

The operation of the solid-state imaging device in the first embodiment of the invention is described below.

The light entering the microlens 7 is focused, and is separated into lights having individual spectral transmissivity characteristics by the first color filter layer 11, second color filter layer 12 and third color filter layer 13. These separated lights efficiently enter the light sensing part 3 beneath each color filter layer. In this constitution, the distance from the light sensing part 3 to the microlens 7 is equal to the focal length; and therefore as compared with the prior art, the focus is not deviated. Thus, the light enters at a higher focal density. The light entering the light sensing part 3 is converted into an electric signal, thereby operating as a solid-state imaging device for presenting a color pictorial image.

Referring then to FIGS. 2 to 16, the manufacturing method of a solid-state imaging device in the second embodiment of the invention is described below.

Figure 2:
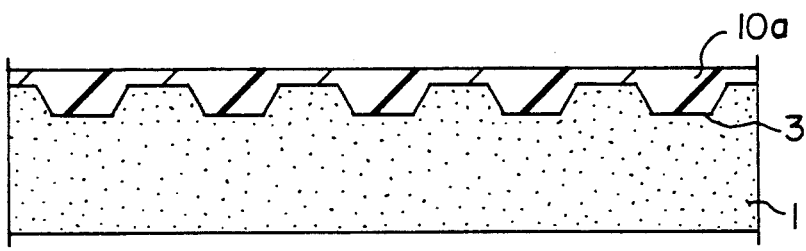
FIG. 2 is a partial cross section showing a first step of the manufacturing method of a solid-state imaging device in a second embodiment of the invention.

FIG. 2 shows the state of forming a first etching resistant material layer 10a for planarizing the surface asperities of the solid-state imaging device substrate 1. Here, the thickness of the first etching resistant material layer 10a is a minimum thickness necessary for planarizing the surface asperities of the solid-state imaging device substrate 1.

Figure 3:
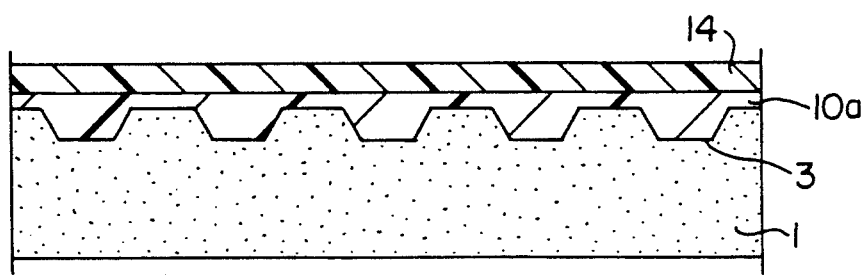
FIG. 3 is a partial cross-section showing a second step of the manufacturing method of a solid-state imaging device in the second embodiment of the invention.
Figure 4:
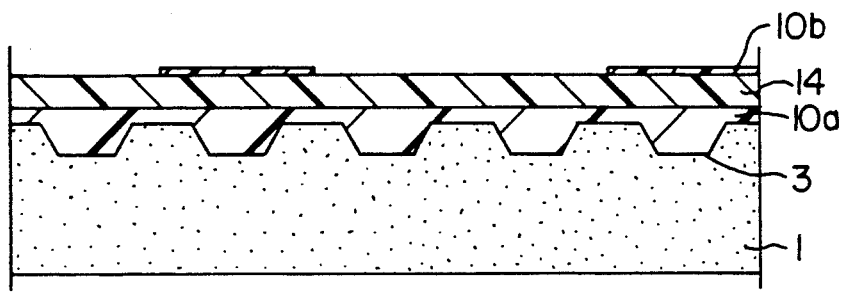
FIG. 4 is a partial cross section showing a third step of the manufacturing method of a solid-state imaging device in the second embodiment of the invention.
Figure 5:
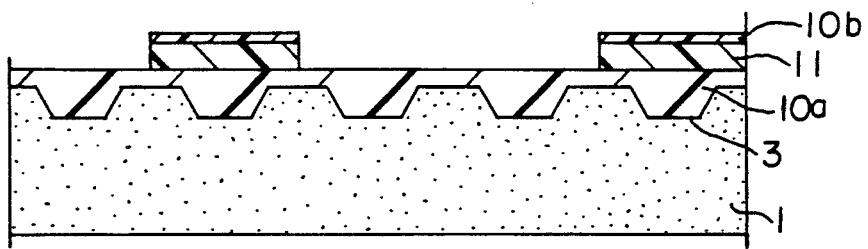
FIG. 5 is a partial cross section showing a fourth step of the manufacturing method of a solid-state imaging device in the second embodiment of the invention.

FIG. 3 shows the state of forming a first colored material layer 14 by coating the first etching resistant material layer 10a with an acrylic material having a characteristic of, for example, red as the intended spectral transmissivity characteristic. The first colored material layer 14 is thermally cured at this step. FIG. 4 shows the state of forming a second etching resistant material layer 10b on the first colored material layer 14 and only above the intended light sensing part 3 to be used as the resist mask. The second etching resistant material layer 10b is formed by selective exposure, development and rinsing. In succession, FIG. 5 shows the state of forming a first color filter layer 11 by removing the first colored material layer 14 of other than masked by the second etching resistant material layer 10b, by dry etching using oxygen plasma, as etching means on the state in FIG. 4.

Figure 6:
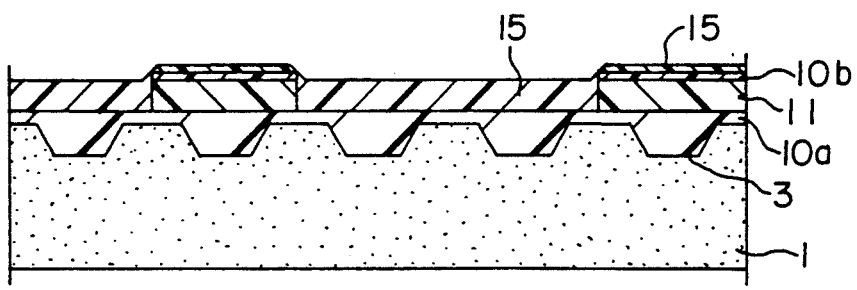
FIG. 6 is a partial cross section showing a fifth step of the manufacturing method of a solid-state imaging device in the second embodiment of the invention.
Figure 7:
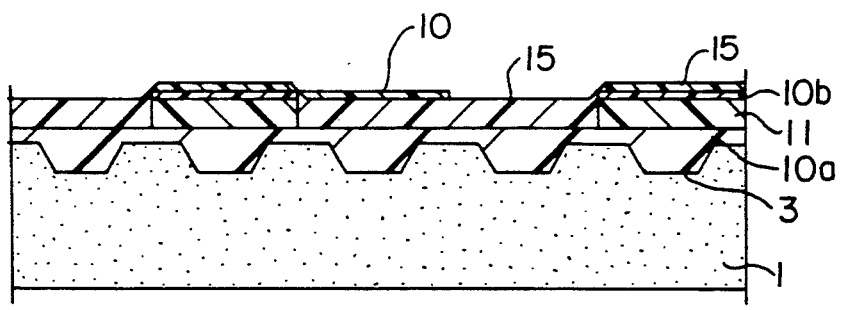
FIG. 7 is a partial cross section showing a sixth step of the manufacturing method of a solid-state imaging device in the second embodiment of the invention.
Figure 8:
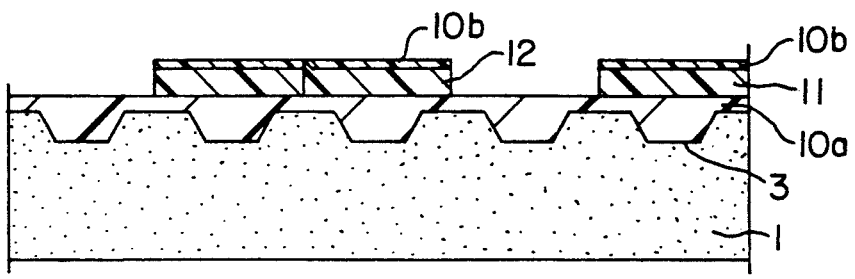
FIG. 8 is a partial cross section showing a seventh step of the manufacturing method of a solid-state imaging device in the second embodiment of the invention.

FIG. 6 shows the state of forming a second colored material layer 15 by applying an acrylic material having a characteristic of, for example, green as the spectral transmissivity characteristic on the whole surface of the first and second etching resistant material layer 10a and 10b. The second colored material layer 15 is formed, for example, by so called "short-spin coating". The short-pin coating is executed by the following steps. A resist is dropped on a wafer, and the wafer is rotated by high speed rotation in a very short time. The time is a few seconds. Then, the wafer rotation is stopped. As a result, the second colored material layer 15 on the first etching resistant material layer 10a becomes thick, and the second colored material layer 15 on the second etching resistant material layer 10b becomes thin, as shown in FIG. 6. Here, the second color material layer 15 is thermally cured. FIG. 7 shows the state of forming the second etching resistant material layer 10b on the second colored material layer 15 only above the intended light sensing part 3 to be used as the resist mask. The method of patterning on the desired position is as mentioned above. FIG. 8 shows the state of forming a second color filter layer 12 by removing the second colored material layer 15 other than the part masked by the second etching resistant material layer 10b, by dry etching as in FIG. 5, in the state in FIG. 7.

Figure 9:
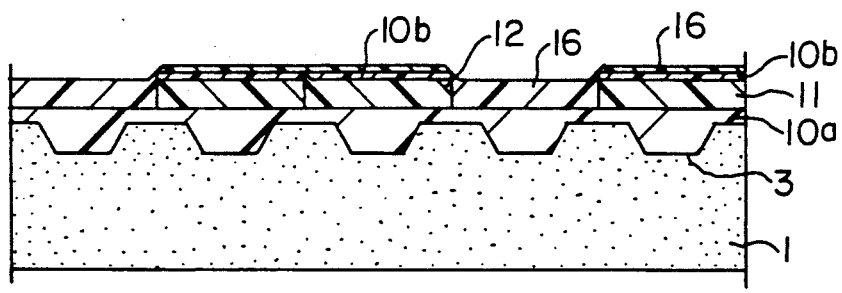
FIG. 9 is a partial cross section showing an eighth step of the manufacturing method of a solid-state imaging device in the second embodiment of the invention.
Figure 10:
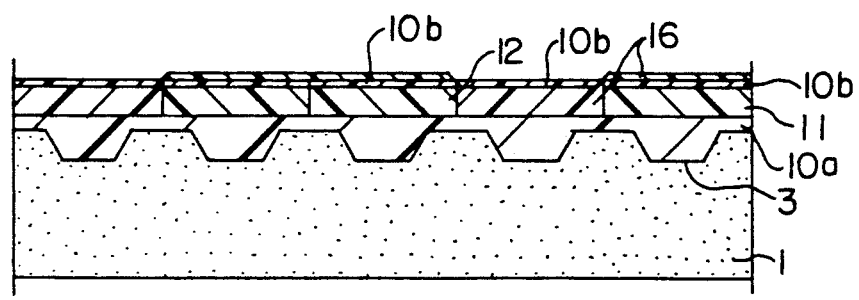
FIG. 10 is a partial cross section showing a ninth step of the manufacturing method of a solid-state imaging device in the second embodiment of the invention.
Figure 11:
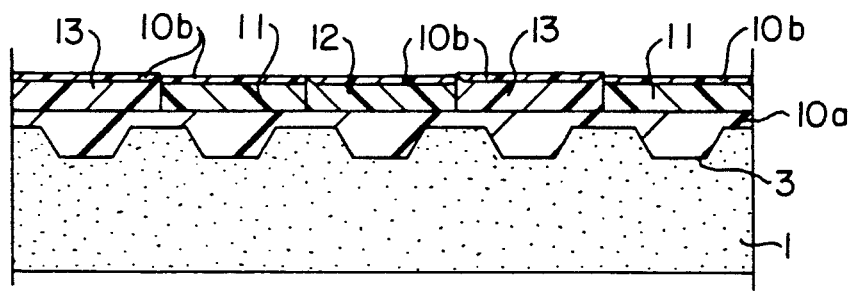
FIG. 11 is a partial cross section showing a tenth step of the manufacturing method, of a solid-state imaging device in the second embodiment of the invention.

FIG. 9 shows the state of forming a third colored material layer 16, by applying an acrylic material having a characteristic of, for example, yellow, as the intended spectral transmissivity characteristic on the whole surface of the first and second etching resistant material layers 10a and 10b. The third colored material layer 16 is formed by the same short-spin coating used for the second the colored material layer 15. Here, the third colored material layer 16 is thermally cured. FIG. 10 shows the state of forming the second etching resistant material layer 10b on the third colored material layer 16 and above only the intended light sensing part 3 to be used as resist mask. The method of patterning on the desired area is as shown above. FIG. 11 shows the state of forming a third color filter 13 by removing the third colored material layer 16 other than the part masked by the second etching resistant material layer 10b similarly as in FIG. 5 and FIG. 8, in the state of FIG. 10.

Figure 12:
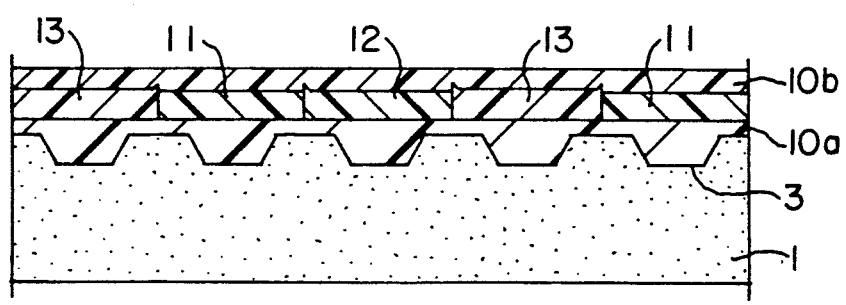
FIG. 12 is a partial cross section showing an eleventh step of the manufacturing method of a solid-state imaging device in the second embodiment of the invention.

FIG. 12 shows the state of forming the final second etching resistant material layer 10b on a single color filter layer in order to planarize the surface asperities of the first color filter layer 11, second color filter layer 12 and third color filter layer 13.

Figure 13:
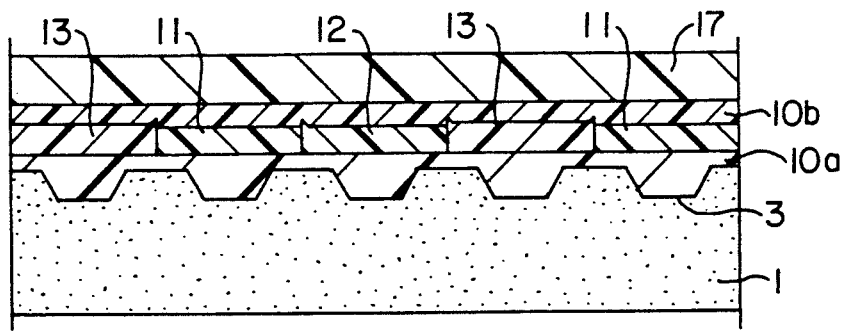
FIG. 13 is a partial cross section showing a twelfth step of the manufacturing method of a solid-state imaging device in the second embodiment of the invention.
Figure 14:
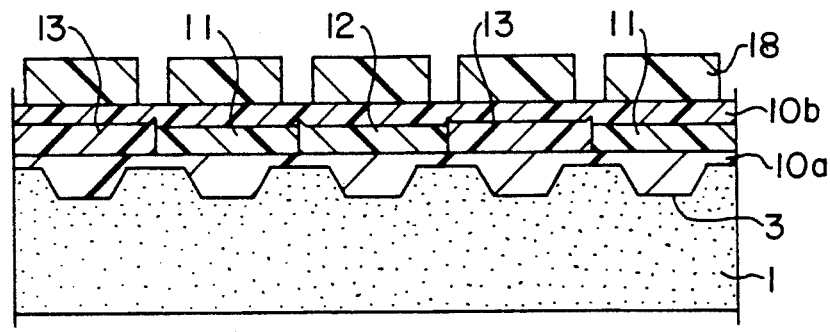
FIG. 14 is a partial, cross section showing a thirteenth step of the manufacturing method of a solid-state imaging device in the second embodiment of the invention.
Figure 15:
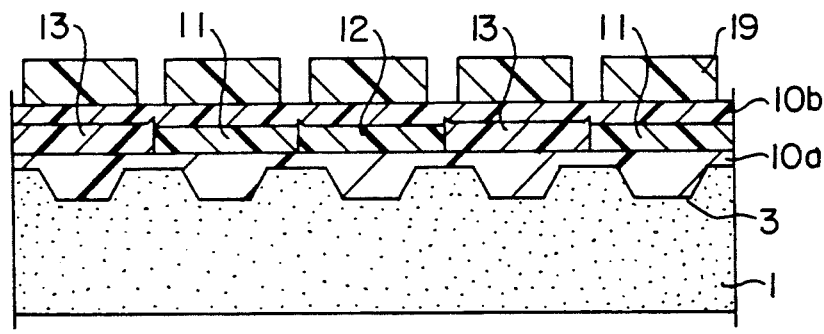
FIG. 15 is a partial cross section showing a fourteenth step of the manufacturing method of a solid-state imaging device in the second embodiment of the invention.
Figure 16:
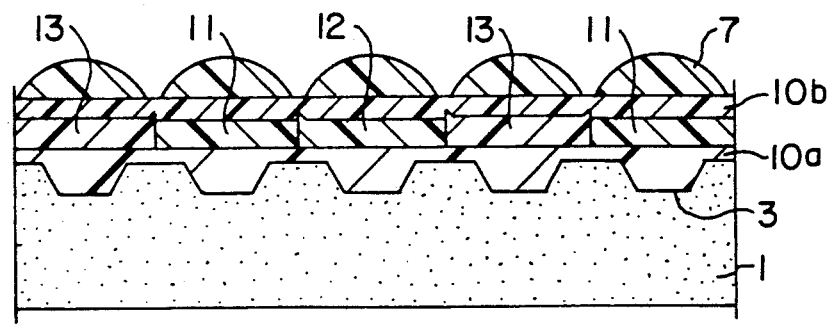
FIG. 16 is a partial cross section showing a fifteenth step of the manufacturing method of a solid-state imaging device in the second embodiment of the invention.
Figure 17:
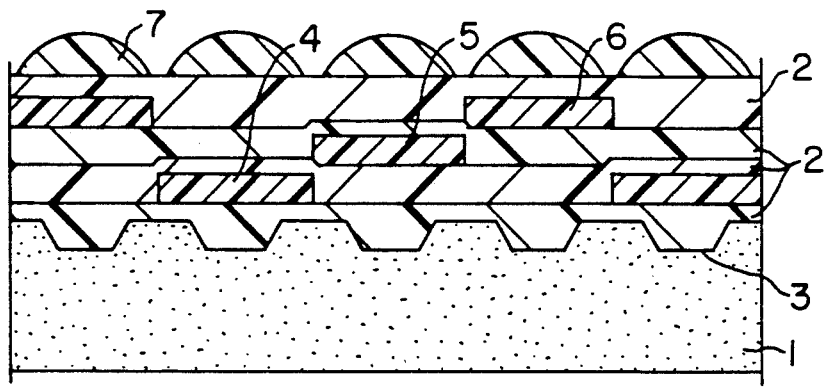
FIG. 17 is a partial cross section showing the constitution of a solid-state imaging device in the prior art.
Figure 18:
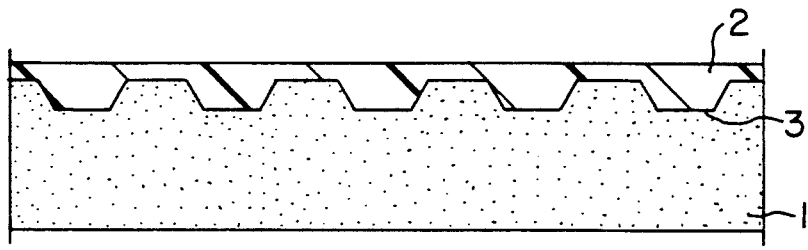
FIG. 18 is a partial cross section showing a first step of the manufacturing method of a solid-state imaging device in the prior art.
Figure 19:
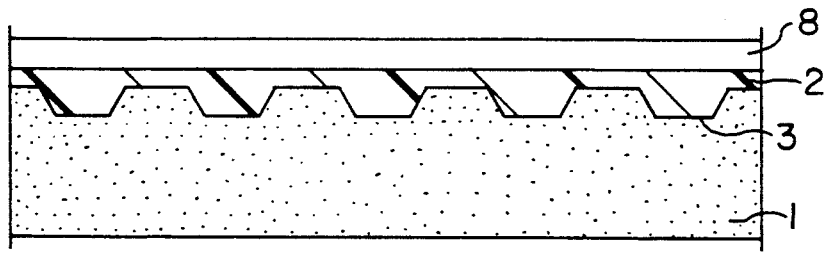
FIG. 19 is a partial cross section showing a second step of the manufacturing method of a solid-state imaging device in the prior art.
Figure 20:
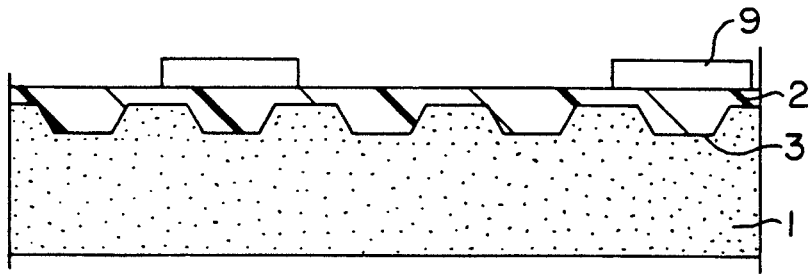
FIG. 20 is a partial cross section showing a third step of the manufacturing method of a solid-state imaging device in the prior art.
Figure 21:
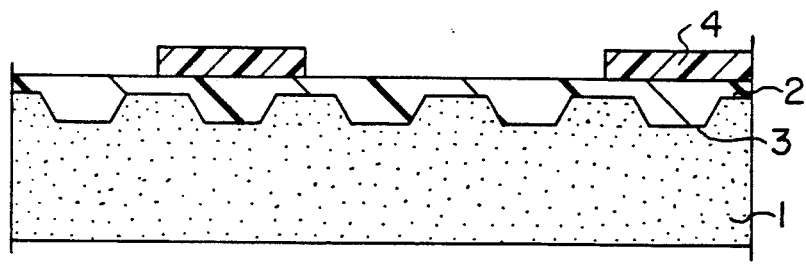
FIG. 21 is a partial cross section showing a fourth step of the manufacturing method of a solid-state imaging device in the prior art.
Figure 22:
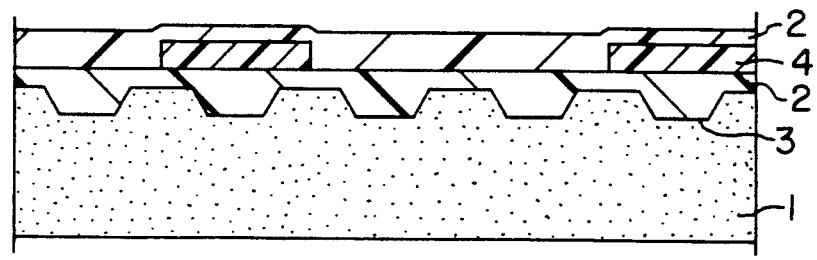
FIG. 22 is a partial cross section showing a fifth step of the manufacturing method of a solid-state imaging device in the prior art.
Figure 23:
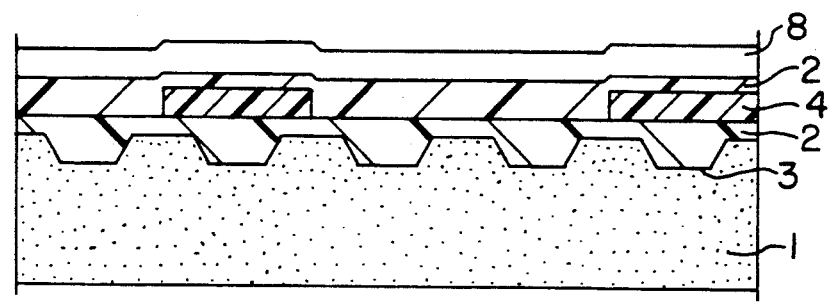
FIG. 23 is a partial cross section showing a sixth step of the manufacturing method of a solid-state imaging device in the prior art.
Figure 24:
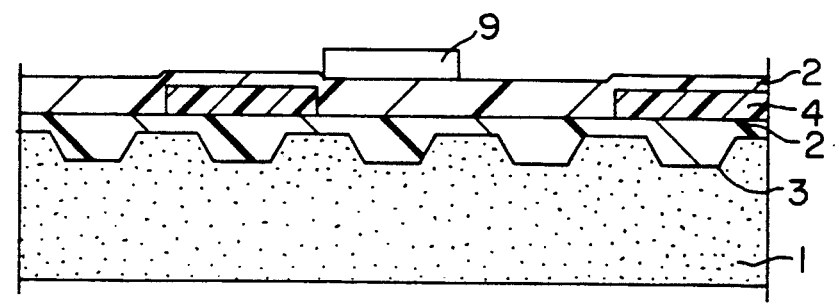
FIG. 24 is a partial cross section showing a seventh step of the manufacturing method of a solid-state imaging device in the prior art.
Figure 25:
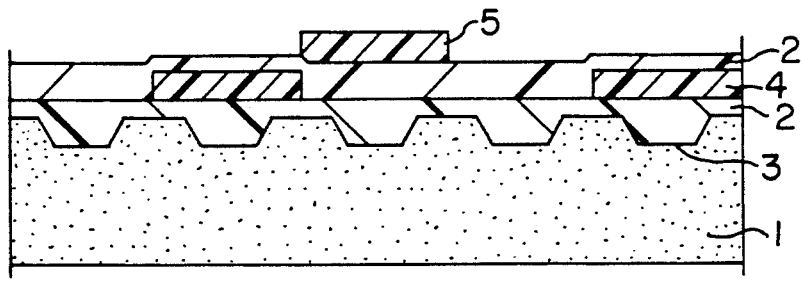
FIG. 25 is a partial cross section showing an eighth step of the manufacturing method of a solid-state imaging device in the prior art.
Figure 26:
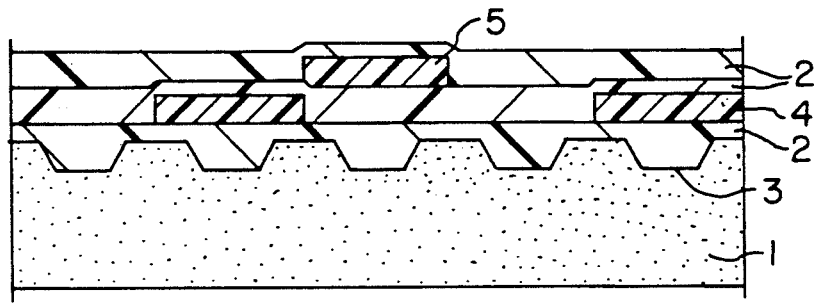
FIG. 26 is a partial cross section showing a ninth step of the manufacturing method of a solid-state imaging device in the prior art.
Figure 27:
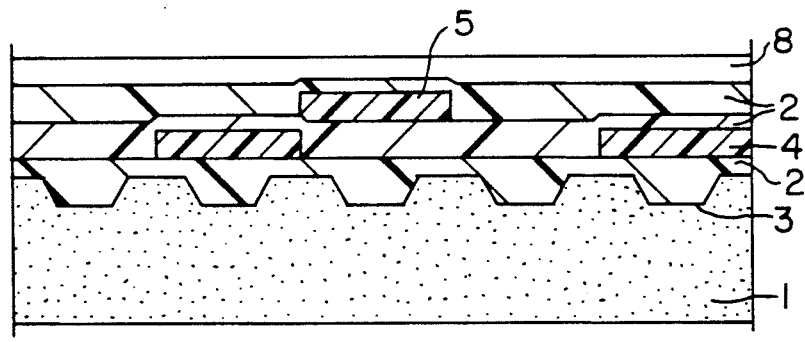
FIG. 27 is a partial cross section showing a tenth step of the manufacturing method of a solid-state imaging device in the prior art.
Figure 28:
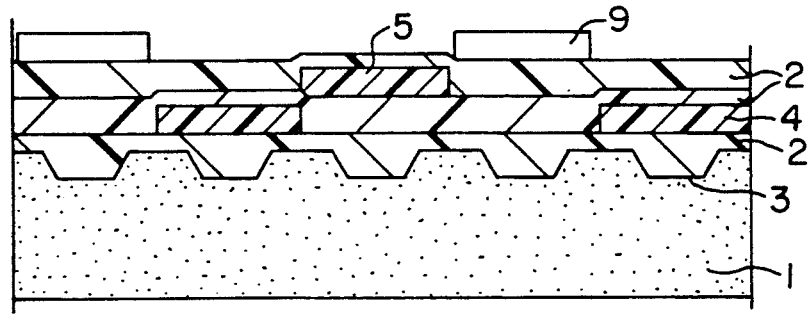
FIG. 28 is a partial cross section showing an eleventh step of the manufacturing method of a solid-state imaging device in the prior art.
Figure 29:
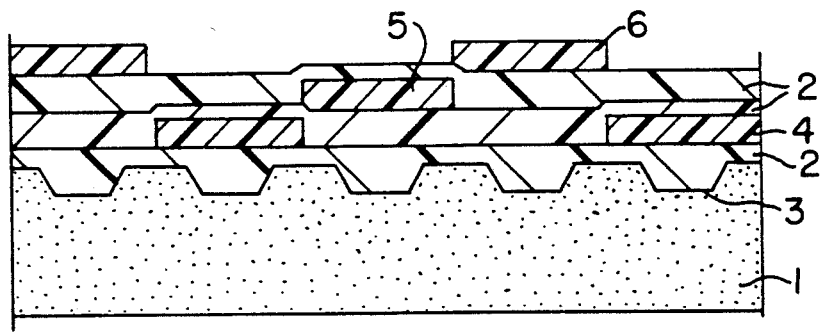
FIG. 29 is a partial cross section showing a twelfth step of the manufacturing method of a solid-state imaging device in the prior art.
Figure 30:
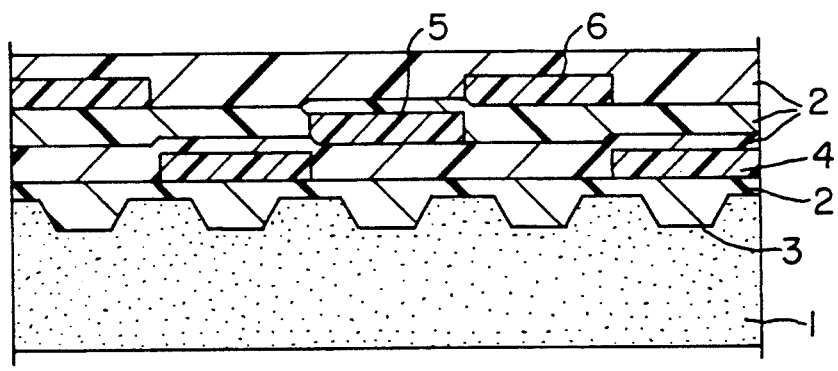
FIG. 30 is a partial cross section showing a thirteenth step of the manufacturing method of a solid-state imaging device in the prior art.
Figure 31:
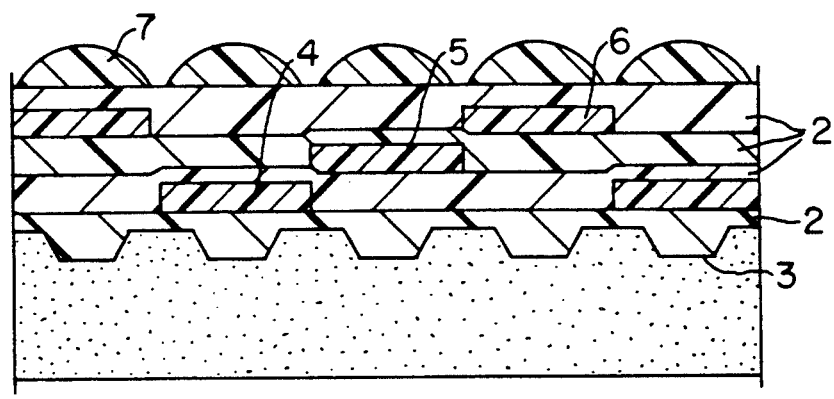
FIG. 31 is a partial cross section showing a fourteenth step of the manufacturing method of a solid-state imaging device in the prior art.

FIG. 13 shows the state of forming a photosensitive material layer 17 by using a material having a thermal softening property which is cured after being softened. FIG. 14 shows the state of forming a photosensitive material pattern 18 by selectively exposing the photosensitive material layer 17 with light (i-rays) of wavelength of 365 nm by using a mask, and developing and rinsing. The wavelength of the light for exposure above may be also other than i-rays, such as g-rays of 436 nm, h-rays of 405 nm, or light including all these wavelengths. For forming fine patterns, the i-rays of short wavelengths is desired. FIG. 15 shows the state of forming a photosensitive material layer pattern 19 made transparent by enhancing the transmissivity of the visible ray region by over 90% by fully exposing the photosensitive material layer pattern 18 with light in the wavelength of the ultraviolet region. FIG. 16 shows the state of forming the microlens 7 by heating and melting the transparent photosensitive material layer pattern 19 at 150° to 200° C. so as to form a hemispheric shape by the surface tension.

To form the etching resistant material layers 10a and 10b used in planarizing the surface asperities or as a resist mask, a material having resistance to, for example, $O_2$ ashing may be used as dry etching using oxygen plasma.

As the colored transparent material of the first colored material layer 14, second colored material layer 15 and third colored material layer 16 for forming the first color filter layer 11, second color filter layer 12 and third color filter layer 13, an acrylic material blended with a pigment with a desired spectral transmissivity characteristic is preferably used. Examples of such acrylic material may include organic high polymer transparent material containing polymethyl methacrylate (PMMA), polyglycidyl methacrylate (PGMA) or their copolymer. Besides, any other material may be used which possesses hardening properties and is removable by dry etching means such as $O_2$ ashing using oxygen plasma, whether possessing photosensitivity or not.

As the material of photosensitive material layer 17 for forming the microlens 7, for example, ultraviolet photosensitive positive resist of phenol compound using naphthoquinone diazide as the photosensitive group may be used, but any other material may be used which is superior in adhesion and affinity for the first etching resistant material layer 10a in the lower layer, and is capable of forming a fine pattern by selective exposure. Any other material may be used as far as enhancing the transmissivity of the visible ray region by over 90% by the light in the wavelength in the ultraviolet region.

Thus, in the solid-state imaging device of the invention, a color filter layer of plural colors is formed in a same layer by a colored transparent material possessing intended spectral transmissivity characteristics. Accordingly, the color filter layers are not different in steps, transparent material is not present between color filters, and the color filter is thinner on the whole than in the prior art. Accordingly, the distance from the color filter to the light sensing part is not long, and the distance is uniform in each color filter, so that flicker and other defects in image characteristics may be eliminated. On the whole, the color filter thickness is thin, and the microlens is formed in an adequate focal length, so that the focusing performance is improved, and the light sensitivity of the light sensing part is enhanced. As compared with the prior art, the color filter is not formed in multiple layers, and cracks or damages of the filter due to external thermal impact are eliminated, so that the reliability is enhanced.

In the manufacturing method, using colored transparent material, the color filter can be formed without a dyeing process, and the manufacturing process is shortened. Besides, the colored transparent material is not required to have photosensitivity, and does not contain harmful substances such as chromium (VI), so that a contamination-free manufacturing method is realized.

What is claimed:

1. A solid-state imaging device comprising:
    a plurality of light sensing parts sequentially formed on a solid-state imaging device substrate,
    a first etching resistant material layer having a flat surface formed on said solid-state imaging device substrate,
    a color filter layer having a plurality of filter regions disposed therein, said filter regions formed in said color filter layer so that the filter regions do not overlap each other, said filter regions possessing different spectral transmissivity characteristics, said color filter layer comprising an acrylic colored transparent material blended with a pigment, said pigment having a desired spectral transmissivity characteristic, a second etching resistant material layer having a flat surface formed on the color filter layer, and a microlens which has substantially hemispheric shape formed on said second etching resistant material layer.

2. A solid state imaging device of claim 1, wherein said microlens is a photosensitive resist of phenol compound having naphthoquinone diazide as the photosensitive group.

3. A solid-state imaging device of claim 1, wherein the color filter layer is composed of an organic high molecular colored transparent material.

4. A solid state imaging device of claim 3, wherein said organic high molecular colored transparent material is a copolymer of polymethyl methacrylate and polyglycidyl methacrylate.

* * * * *